(12) United States Patent
Zhang et al.

(10) Patent No.: US 7,518,553 B2
(45) Date of Patent: Apr. 14, 2009

(54) INTEGRATING AN ANTENNA AND A FILTER IN THE HOUSING OF A DEVICE PACKAGE

(76) Inventors: Yue Ping Zhang, 75A Nanyang View, Singapore (SG) 639656; Joseph Sylvester Chang, Hall 4, NTU, Block 23, #02-465, 10 Nanyang Drive, Singapore (SG) 637220

( * ) Notice: Subject to any disclaimer, the term of this patent is extended or adjusted under 35 U.S.C. 154(b) by 640 days.

(21) Appl. No.: 10/969,406

(22) Filed: Oct. 20, 2004

(65) Prior Publication Data

US 2005/0090300 A1    Apr. 28, 2005

(30) Foreign Application Priority Data

Oct. 22, 2003    (SG) .............................. 200306151-2

(51) Int. Cl.
*H01Q 1/38*    (2006.01)
*H01Q 1/40*    (2006.01)

(52) U.S. Cl. ................................. 343/700 MS; 343/873
(58) Field of Classification Search .......... 343/700 MS, 343/702, 846, 872, 873
See application file for complete search history.

(56) References Cited

U.S. PATENT DOCUMENTS

| | | | | |
|---|---|---|---|---|
| 5,786,738 | A | * | 7/1998 | Ikata et al. ................... 333/133 |
| 2001/0052645 | A1 | * | 12/2001 | Op'T Eynde et al. ....... 257/700 |

* cited by examiner

*Primary Examiner*—Shih-Chao Chen
(74) *Attorney, Agent, or Firm*—Osha • Liang LLP (57) ABSTRACT

A device package for radio frequency transceivers that comprises radio electronics, a filter and an antenna. The filter and antenna are realized using one or more metallization layers in the housing of the device package. The filter and antenna in the housing of the device package allows the realization of a compact RF transceiver with a small form-factor.

18 Claims, 9 Drawing Sheets

Figure 3: Prior-Art

Figure 4: Prior-Art

INTEGRATING AN ANTENNA AND A FILTER IN THE HOUSING OF A DEVICE PACKAGE

FIELD OF THE INVENTION

This invention relates to a filter and an antenna, and particularly to a filter and antenna simultaneously embodied within the housing of a device package, thereby allowing the realization of a compact small form-factor radio frequency transceiver.

BACKGROUND OF THE INVENTION

The trend of the design of many portable electronic devices is towards smaller devices for portability, aesthetics, and other reasons. Examples of portable electronic devices include mobile radio frequency (RF) transceivers, including cellular mobile handsets, wireless local area networks (WLAN) and the like. WLAN transceivers have recently become increasingly prevalent with the USA Federal Communications Commission's (FCC) allocation of 300 MHz bandwidth in the 5 GHz frequency band for the Unlicensed National Information Infrastructure (UNII) and with the European High Performance Radio Local Area Network Type 2 (HIPERLAN/2) system.

Traditionally, the complete RF transceiver is constructed by a number of interconnected integrated circuit (IC) dies (that are packaged in their respective IC packages) on a motherboard with passive components, and external parts: filter, and antenna (and associated shielding). The IC dies are traditionally and usually assembled in epoxy resin or in ceramic packages. In this traditional approach, the primary functions of the package are simply a means of interconnecting the integrated circuit die to the external world (the pins of the IC package) and a means of protecting the IC die for reliability.

With technological advances in IC technology, the functionality of the several IC dies in their respective IC packages and most of the passive components of the complete RF transceiver can now be realized (in part depending on the specific architecture of the RF transceiver) by a single IC die and/or packaged into a single device package. In IC fabrication technology, the downscaling of the minimum feature size of the fabrication technology allows more circuitry to be realized in a given IC die area. For some electronic systems, a complete system can be realized on a single IC, commonly known as System-on-Chip (SoC), and the complete system is packaged into a single device package. In IC packaging technology, a plurality of IC dies may be stacked and interconnected, commonly known as stacked die package using 3D packaging technologies, and/or several interconnected IC dies and passive components on a single substrate. For some electronic systems, a complete system is packaged into a single device package, commonly known as System-in-Package (SiP).

Figure 1:
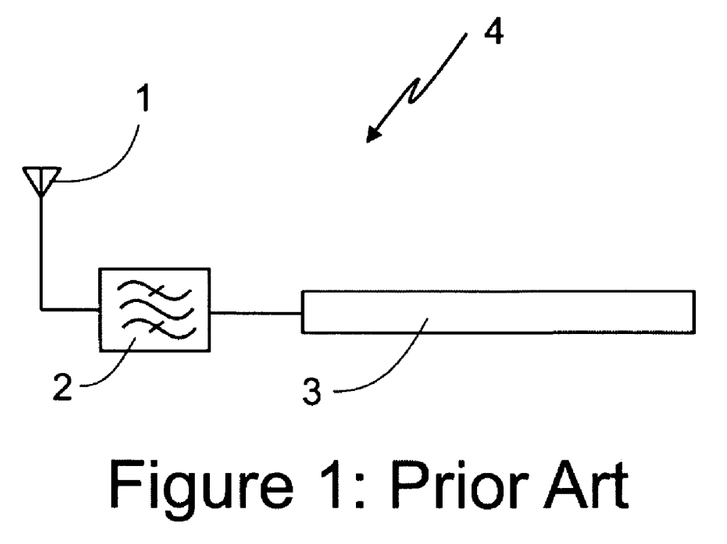
FIG. 1 is a block diagram of a general RF transceiver.

FIG. 1 depicts the functional blocks of RF Transceiver 4 that includes three separate modules: Antenna 1, Filter 2 and Radio Electronics 3. Note that Radio Electronics 3 may comprise a single or a plurality of IC packages and/or passive components, and they may be placed on a substrate and/or a printed circuit board motherboard. In traditional designs, the components in Radio Electronics are assembled on a motherboard and are connected to Filter 2 and Antenna 1. Antenna 1 and Filter 2 are usually connected by ports with a common impedance.

Figure 2:
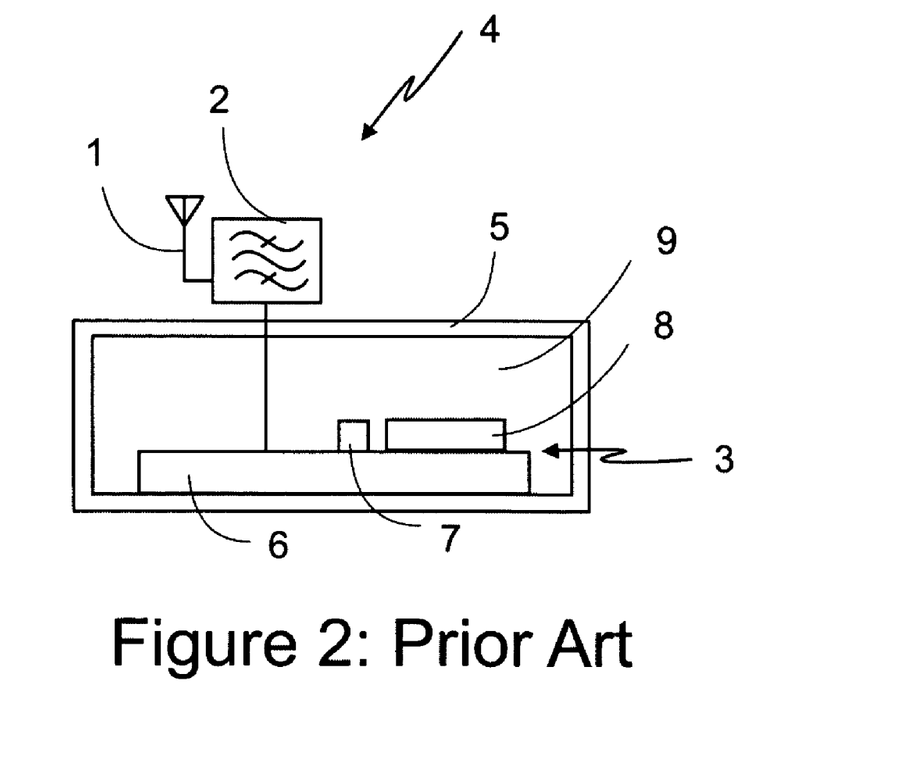
FIG. 2 is a block diagram of a prior-art RF transceiver where the electronics are placed within the cavity of the device package, and the antenna and the filter are placed external to the device package.

The bulk of Radio Electronics 3 is traditionally realized in Bipolar, Silicon-Germanium and Gallium Arsenic technologies due to their high unity gain cut-off frequency. However, with the continuing downscaling of Complementary Metal Oxide Semiconductor (CMOS) technology and for cost considerations, Radio Electronics 3 is now largely realized in CMOS. For example, deep submicron CMOS technology such as 0.18 μm or smaller dimensioned CMOS technology can be used to realize radio circuits operating in many frequencies including the 5 GHz range. As a result of continuing downscaling, the bulk of Radio Electronics 3 can now be realized by a single IC die or a plurality of IC dies in a single device package, or a single or a plurality of IC dies and passive components on a substrate in a single device package. FIG. 2 depicts this prior-art RF Transceiver 4 realization where IC Die 8 and Passive Component 7 are placed Substrate 6, all within Cavity 9 of Device Package 5. Radio Electronics 3 may comprise Substrate 6, Passive Component 7 and IC Die 8, and depending on the specific architecture of and technology used for RF Transceiver 4, Passive Component 7 and/or Substrate 6 may not be required. In some prior-art realizations, Filter 2 may also be realized on and/or embedded in Substrate 6, or it may be external to Device Package 5 as depicted in FIG. 2, or it may be integrated as part of the housing of Device Package 5 (refer to FIG. 4 later). Antenna 1, on the other hand, may be connected external to Device Package 5 as shown in FIG. 2 and/or it may be integrated as part of housing of Device Package 5 (refer to FIG. 3 later). In all prior-art designs, Antenna 1 and Filter 2 are not simultaneously realized as part of the housing of Device Package 5. These prior-art designs will now be described in some detail.

Antenna 1 is the component of the RF transceiver that radiates and/or receives the RF. In most transceivers, Antenna 1 serves as a reciprocal antenna—the same antenna serves as the radiating and as the receiving antenna. Antenna 1 is usually traditionally realized external to and separate of the other parts of RF Transceiver 4 because its properties are essentially independent thereof. The well-known antenna assemblies for transceivers include the external wire antenna (otherwise known as the whip antenna), the quarter wave straight wire antenna, the coiled quarter wave wire antenna, the Planar Inverted F Antenna (PIFA), and the patch antenna.

Figure 3:
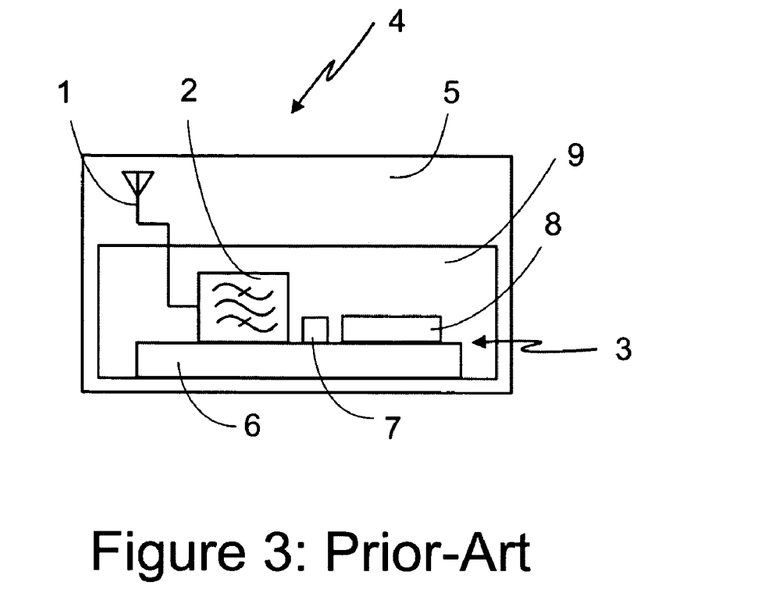
FIG. 3 is a block diagram of a prior-art RF transceiver where the electronics and the filter are placed within the cavity of the device package and the antenna is realized as part of the housing of the device package.

As abovementioned herein, a variation of prior-art designs depicted in FIG. 2 is shown in FIG. 3 where Antenna 1 is integrated into the housing of Device Package 5. This is somewhat prevalent in Bluetooth applications and the like. For example, Zhang in a paper entitled, "Integration of Microstrip Antenna on Cavity-Down Ceramic Ball Grid Array Package", *Electronics Letters*, Vol. 38, No. 22, pp. 1307-1308, October 2002 (Zhang 2002a), reported the integration of a microstrip antenna within the housing (surface of top section thereof) of Device Package 5, a thin 17×17×2 mm cavity down ceramic ball grid array (BGA) package. In this prior-art design, IC Die 8 is encapsulated in Device Package 5, a BGA package. In this design as in all prior-art designs, the Filter 2 is not simultaneously realized within the housing of Device Package 5. Instead as shown in FIG. 3, Filter 2 is either realized on/embedded in Substrate 6 where IC Die 8 and/or Passive Component 7 are also attached, or it may be external to Device Package 5. In cases where Device Package 5 is a high dielectric material such as Low-Temperature Co-fired Ceramic (LTCC), IC Die 8 and/or Passive Component 7 may be attached directly to the base and/or top of Cavity 9. A layer of the housing of Package Device 5 may serve as the substrate. Cavity 9 may be filled with a resin or hermetically sealed with a sealing metal cap.

In an article by Gaynor et. al. entitled, "System-in-Package for WLAN/PAN Aids Coexistence with Digital Cellular, *High Frequency Electronics*, pp. 30-41, January 2003 (Gaynor et. al., 2003), Antenna 1 realized as an integrated antenna module realized within Device Package 5 was reported. This prior-art design is as that depicted in FIG. 3 and is already previously described herein. There are also several other prior-art designs reporting the same design methodology, including that involving an integrated antenna for a Bluetooth transceiver. In all these prior-art designs, Antenna 1 and Filter 2 are not simultaneously part of the housing of Device Package 5.

The filtering function of Filter 2 is usually realized by external SAW and ceramic block filter technologies. Traditionally, as explained earlier herein, Filter 2 and other filters (depending on the architecture of and technology employed for RF Transceiver 4) are usually placed on the same motherboard as Radio IC 3 (that is encapsulated in one or more IC packages). In some designs, Filter 2 may be placed on a separate motherboard. Traditional radio circuit architectures including those that are embodied in Radio IC 3 require high Q analog bandpass filters for image frequency rejection and for channel selection and these high Q analogue bandpass filters are in addition to Filter 2. More recently, architectures such as zero- or low-IF require these high Q analogue filters with less stringent requirements, allowing them to be realized on-chip in IC Die 8.

With the advances in IC packaging as discussed previously herein, Filter 2 can be realized using Passive Components 7 on/embedded in Substrate 6 where IC Die 8 is attached thereof. In the case of that embedded in Substrate 6, Substrate 6 having several layers of dielectrics and metal laminates may realize Passive Components 7, including capacitor, resistors and baluns. The common materials for Substrate 6 include BT, Getek, BT-MG and LTCC. An article by Mathews et. al. entitled, "RF System in Package: Tradeoffs Govern the Cost, Size and Performance Equation", 2003 Chip Scale Review (Mathews et. al., 2003), describes the construction of some of these filters in Substrate 6.

Figure 4:
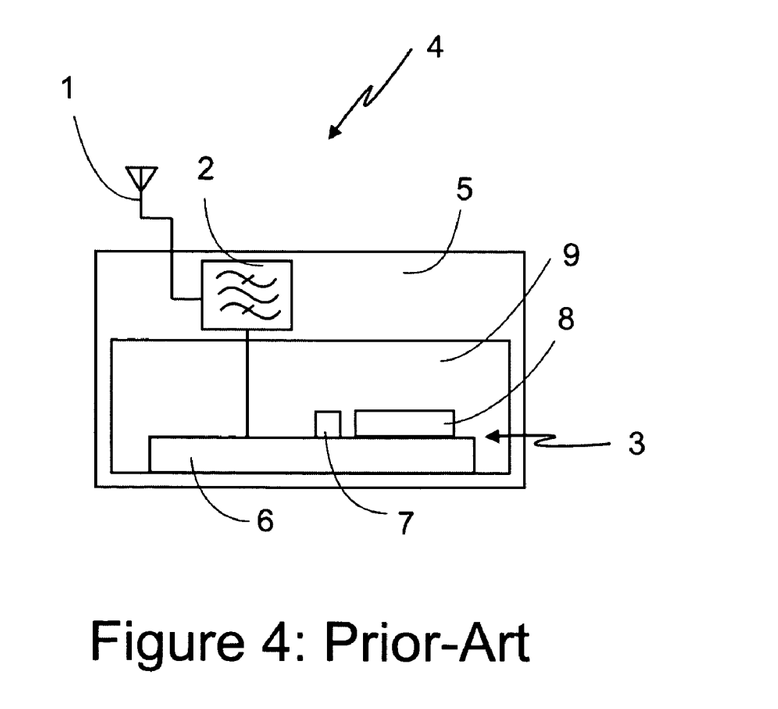
FIG. 4 is a block diagram of a prior-art RF transceiver where the electronics is within the cavity of the device package, the filter is realized as part of the housing of device package and the antenna is placed external to device package.

As the high dielectric materials used for the housing of Device Package 5 are similar to typical substrate materials abovementioned herein, it is feasible to realize filters (previously on/embedded in Substrate 6) in the housing of Device Package 5 and Antenna 1 is external of Device Package 5. This is depicted in FIG. 4 where Filter 2 is realized in the housing of Device Package 5, IC Die 8 and Passive Component 7 are attached to Substrate 6 as shown or directly to one of the surfaces of Device Package 5 (not shown). In FIG. 4, it is possible that Filter 2 be part of any section of Device Package 5, although the top and bottom layers of Device Package 5 are prevalent.

For example, Ishizaki et.al. (Ishizaki et. al., 2003) in U.S. Pat. No. 6,456,172 described an invention where filters are realized in the bottom section of the housing of a cavity-down LTCC Device Package 5 wherein the housing having a plurality of laminated ceramic layers. Passive Components 7 and IC Die 8 may also be attached to one of the internal surfaces of the housing of Device Package 5. Note that Antenna 1 is not simultaneously realized within the housing of Device Package 5 and may be instead be realized external to Device Package 5.

In another prior-art design, Zhang in a paper entitled, "Integration of Dual-Mode RF Bandpass Filter on Ceramic Ball Grid Array Package", *Electronics Letters,* Vol. 38, No. 19, pp. 1106-1107, September 2002 (Zhang 2002b), reported the integration of an RF bandpass filter (Filter 2) on the top layer of a cavity down LTCC BGA Device Package 5. IC Die 8 may be attached to one of the surfaces of Device Package 5. Note that Antenna 1 is not simultaneously realized within the housing of Device Package 5 and may instead be realized external to Device Package 5.

In another prior-art design, Hsieh et.al. in a paper entitled, "Compact-size and Low Insertaion Loss Chebychev-function Bandpass Filters using Dual-Mode Patch Resonators", *Electronics Letters,* Vol. 37, No. 17, pp. 1070-1071, August 2001 (Hsieh et. al., 2001), reported a Chebychev-function bandpass using two square patch resonators, suitable as Filter 2. This filter may be realized on an appropriate high dielectric material such as LTCC or the like as abovementioned herein. In this prior-art work, the antenna was not described and is likely to be external to the device package.

The RF industry demands ever-smaller devices or equivalently, devices with a smaller form factor. As described above herein, the process of making smaller RF Transceivers 4 is essentially the process of increasing the integration density of the different sections of the RF transceiver. In most prior-art designs with a small form factor, the integration involves either realizing Antenna 1 in the housing of Device Package 5 or realizing Filter 2 (and other filters and Passive Components 7) in the housing of Device Package 5.

In the spirit of realizing RF Transceivers 4 with an even smaller form factor, it is highly desirable to have RF Transceiver 4 wherein Antenna 1 and Filter 2 (and where appropriate, other filters and Passive Components 7) are simultaneously realized in the housing of Device Package 5.

SUMMARY OF THE INVENTION

The present invention seeks to provide an RF transceiver with the housing of its packaging having simultaneously the filter and the antenna.

The present invention provides an RF transceiver having an antenna, filter and electronics, wherein the filter and the antenna are simultaneously realized within the housing of its package and the electronics attached to an internal surface of its Package, thereby realizing a compact RF transceiver with a small form factor.

BRIEF DESCRIPTION OF THE DRAWINGS

Embodiments of the present invention shall now be more fully described, by way of examples, with reference to the drawings of which:

FIG. 6(*a*) is a cross-sectional view of housing of the RF device package and FIG. 6(*b*) is an exploded view of the same, and are the first embodiment in accordance with the invention;

FIG. 7(*a*) is a cross-sectional view of housing of the RF device package, FIG. 7(*b*) is an exploded view of the same from the top view, and FIG. 7(*c*) is an exploded view of the same but turned upside down, and are the second embodiment in accordance with the invention;

DETAILED DESCRIPTION OF THE DRAWINGS

FIG. 3 and FIG. 4 depict the block diagrams of a prior-art RF Transceiver 4. In FIG. 3, prior-art RF Transceiver 4 comprises Antenna 1 within the housing of Device Package 5 and the remaining parts of RF Transceiver 4 are in the cavity of Device Package 5. These remaining parts of RF transceiver 4 encapsulated in Cavity 9 of Device Package 5 include Filter 2, Passive Component 7 and IC Die 8 on Substrate 6. In FIG. 4, on the other hand, prior-art RF Transceiver 4 comprises Antenna 1 that is external to Device Package 5, Filter 2 within the housing of Device Package 5 and the remaining parts of RF Transceiver 4 are in the cavity of Device Package 5. These remaining parts of RF transceiver 4 encapsulated in Cavity 9 of Device Package 5 include Passive Component 7 and IC Die 8 on Substrate 6. In some prior-art designs in FIG. 3 and FIG. 4, one of the layers of the housing of Device Package 5 (for example in LTCC packages) may serve as the substrate, thereby eliminating the need for Substrate 6.

Figure 5:
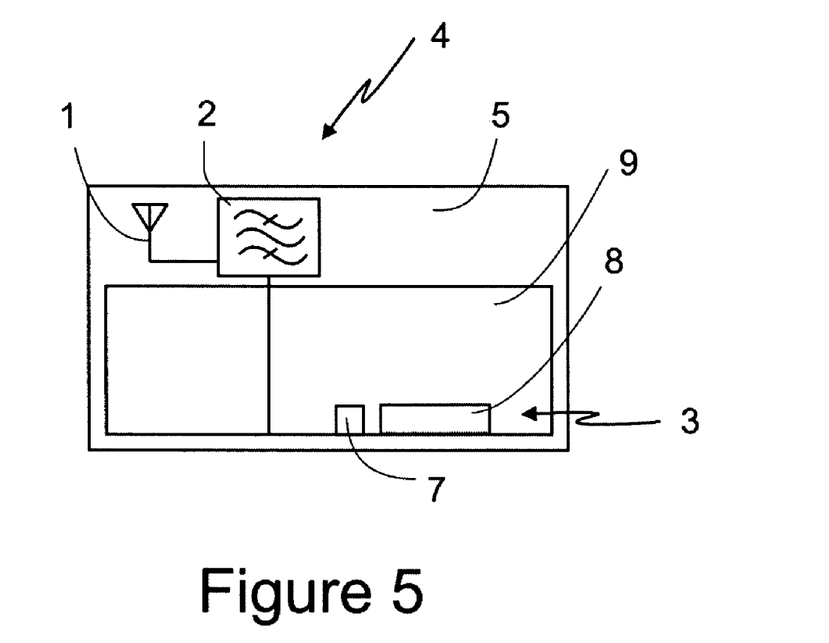
FIG. 5 is a block diagram of the present invention where the RF transceiver has its electronics placed within the cavity of the device package, and the antenna and the filter are simultaneously realized as part of the housing of the device package.

As described earlier, it is highly desirable that RF Transceiver 4 to be as compact as possible, thereby having the smallest form-factor possible. The present invention is an improvement over prior-art designs by offering a design that simultaneously incorporates Antenna 1 and Filter 2 into the housing of Device Package 5, thereby offering a more compact Device Package 5. This is pictorially depicted in FIG. 5 where RF Transceiver 4 comprises Antenna 1 and Filter 2, both embedded within the housing of Device Package 5 and the remaining parts of RF Transceiver 4 are in the cavity of Device Package 5. The remaining parts of RF Transceiver 4 encapsulated in Cavity 9 of Device Package 5 include Passive Component 7 and IC Die 8. In this first embodiment of the invention, Device Package 5 is based on LTCC material and the housing of Device Package 5 can then serve as a multilayer high dielectric substrate, thereby eliminating the need for Substrate 6 in FIGS. 2, 3 and 4. It should be noted that Device Package 5 can be based on other high dielectric materials other than LTCC.

Figure 6A:
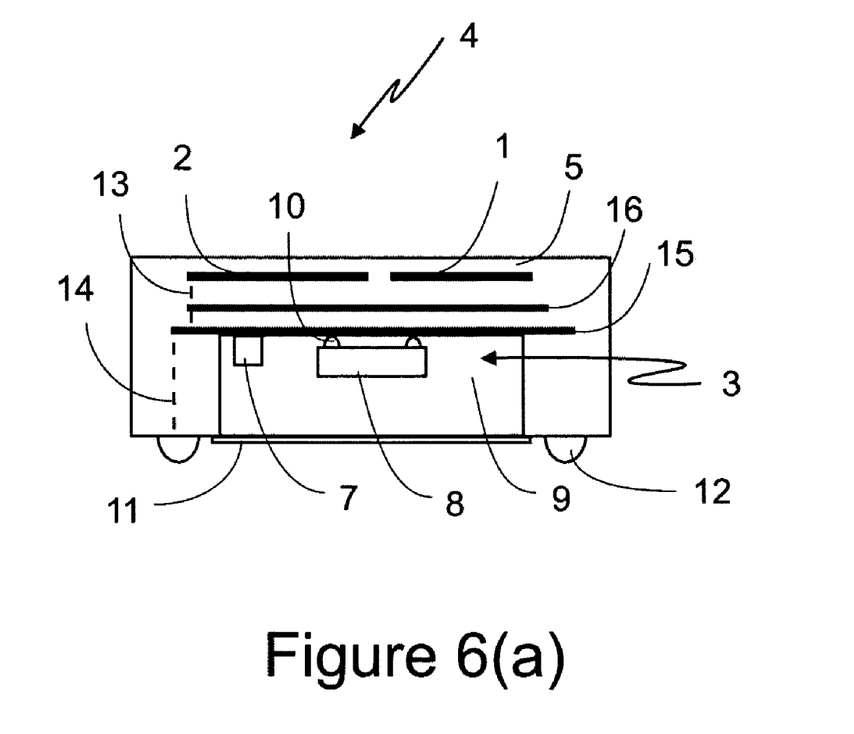

FIG. 6(a) depicts the cross sectional view of the first embodiment of the present invention. Antenna 1 and Filter 2 are interconnected and are metallic-laminate structures located below the top surface of Device Package 5. Antenna 1 and Filter 2 are on the same metallic laminate layer. Antenna 1 may be a patch antenna (refer to FIG. 8 later) or any suitable antenna structures previously described herein. Filter 2 may be that based on the two-patch resonators (see FIG. 8 later) or any suitable structure. Filter 2 is connected to Radio Electronics 3 by means of Via 13 comprising a single via or a plurality of vias. Metallic Laminate 16 serves as a ground plane for Antenna 1 and further serves to shield Radio Electronics 3 comprising Passive Component 7 and IC Die 8. Metallic Laminate 16 is connected to the ground pin of one of the Solder Balls 12 by means of at least one of the vias of Via 13 and at least one of the vias of Via 14. IC Die 8 is connected to Metallic Laminate Layer 15 by means of wire bonding or as shown in FIG. 6(a), by means of bump connection such as stud bump bonding and the like. In most cases, bump connection is preferred over wire bonding because it provides a shorter means of interconnection. Passive Component 7, on the other hand, are soldered directly to Metallic Laminate 15.

Note that in some designs, depending on the specific architecture and implementation of Radio Electronics 3, Passive Component 7 may not be required or may be realized by embedded passive components in the housing of Device Package 5, usually above Cavity 9 and between Metallic Laminate 15 and Metallic Laminate 16; the dielectric layer between Laminate 15 and Laminate 16 may be multilayer comprising a plurality of laminates (not shown). As a means of protecting Radio Electronics 3, Cavity 9 of Device Package 5 may be hermetically sealed with Sealing Metal Cap 11 or may be filled with a resin.

Figure 6B:
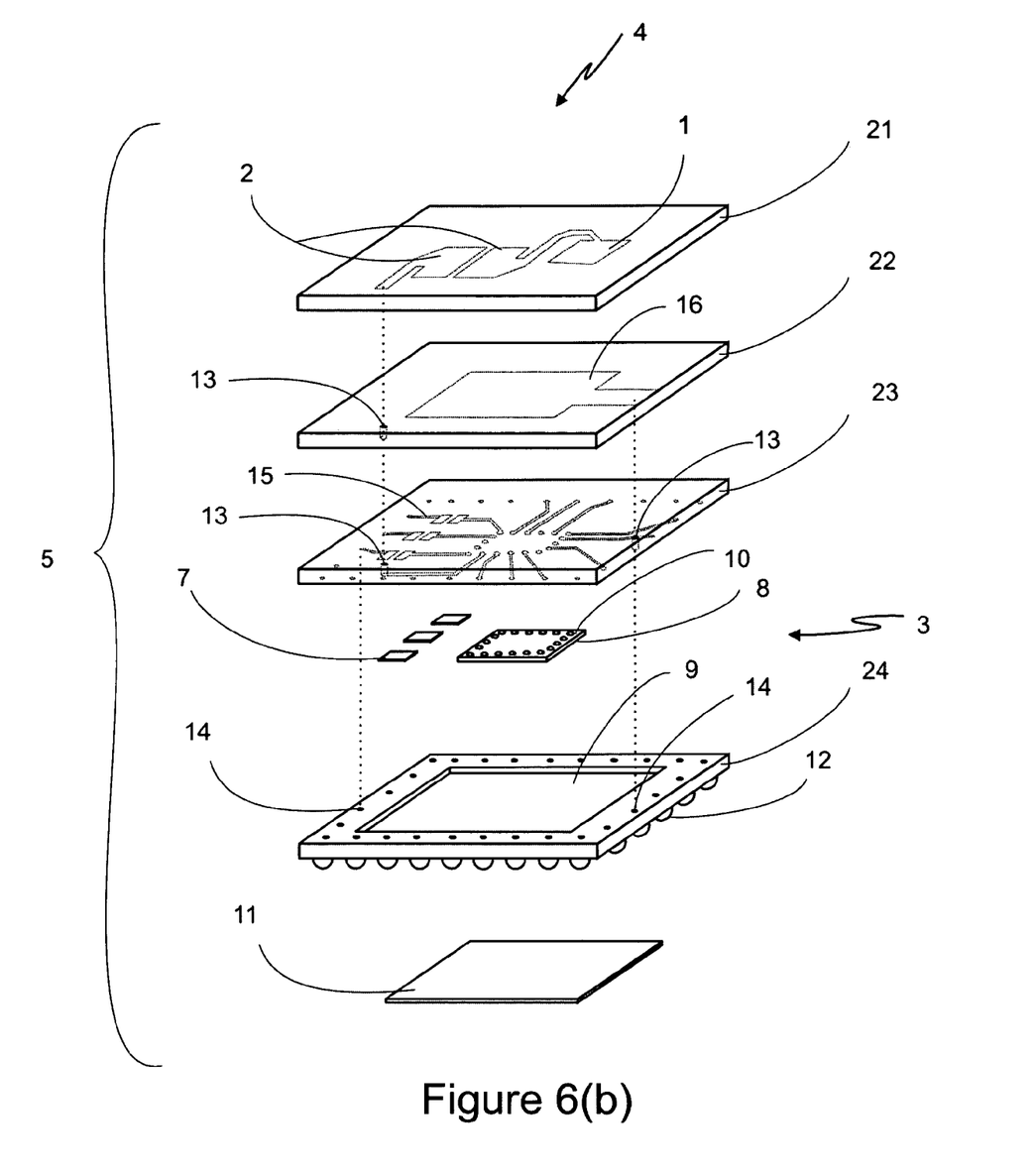

An exploded diagram of the cross-sectional view of RF Transceiver 4 in FIG. 6(a) is depicted in FIG. 6(b), the first embodiment of the present invention. Device Package 5 comprises 4 high dielectric layers, 21, 22, 23 and 24, and when stacked (and processed accordingly) forms the composite housing of Device Package 5 shown in FIG. 6(a) previously. In FIG. 6(b), Layer 21 is the top layer of Device Package 5 and Antenna 1 and Filter 2 are simultaneously realized on its bottom surface. Antenna 1 may be a patch antenna as described previously herein and is part of a metallic laminate on the bottom surface of Layer 21. Connected to Antenna 1 is Filter 2 that may be realized as two-patch resonators as shown. The left end of Filter 2 is connected to Via 13 in both Layers 22 and 23 and is connected to Radio Electronics 3 via metal tracks on Metallic Laminate 15 on the bottom surface of Layer 23. Passive Component 7 and IC Die 8 of Radio Electronics 3 are also interconnected by the same metal tracks on Metallic Laminate 15 and may be connected to Solder Balls 12 by one or more vias of Via 14 that goes through Layer 24. Metal Laminate 16 is the ground plane and is connected to a ground pin of one of Solder Ball 12 by means of Via 13 and Via 14 that go through Layer 23 and Layer 24 respectively. Cavity 9 may be filled with a resin or hermetically sealed with Sealing Metal Cap 11.

Figure 7A:
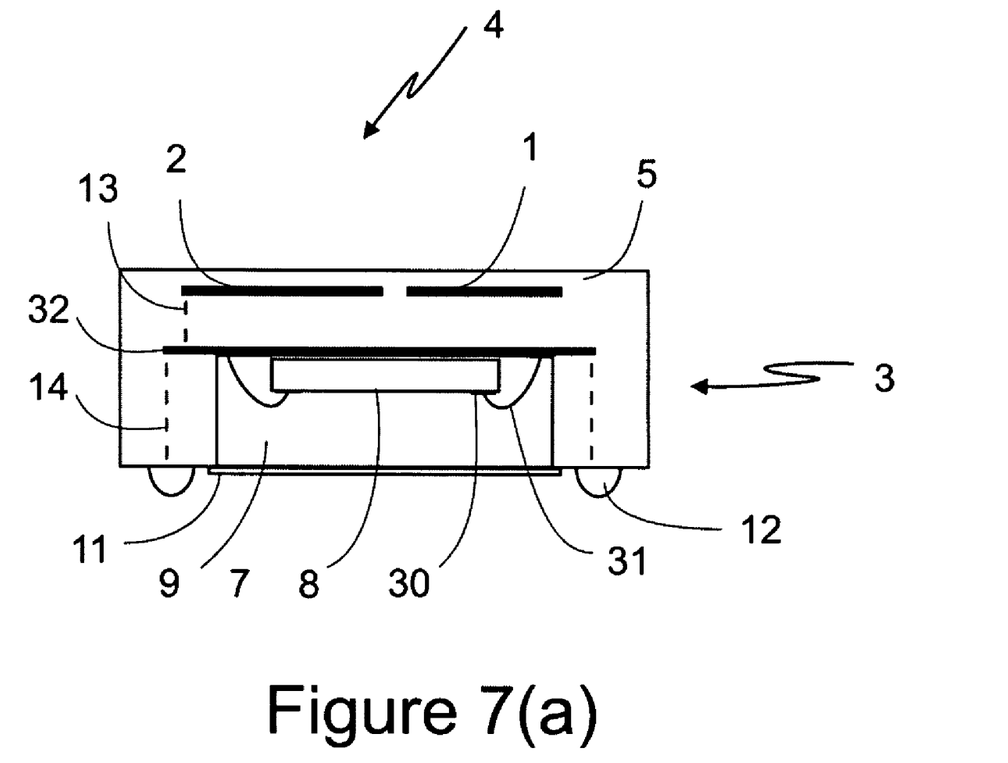

FIG. 7(a) depicts the cross sectional view of the second embodiment of the present invention. Antenna 1 and Filter 2 are interconnected and are metallic-laminate structures located below the top surface of Device Package 5. Antenna 1 and Filter 2 are on the same metallic laminate layer. Antenna 1 may be a patch antenna or any suitable antenna structures previously described herein. Filter 2 may be that based on the two-patch resonators or any suitable structure. Filter 2 is connected to IC Die 8 (Radio Electronics 3) by means of Via 13 comprising a single via or a plurality of vias. Metallic Laminate 32 serves several purposes. It serves as the ground plane for Antenna 1, serves to shield Radio Electronics 3 comprising IC Die 8, serves as the base to which IC Die 8 is conductively adhered to, and serves as interconnection points for Bond Pads 30 of IC Die 8. Bond Wires 31 connect Bond Pads 30 to Metallic Laminate 32 and are connected to Solder Ball 12 by means of Via 14. IC Die 8 resides within Cavity 9. Cavity 9 of Device Package 5 may be hermetically sealed with Sealing Metal Cap 11 or may be filled with a resin as a means of protecting Radio Electronics 3. Passive components (not shown) such as a decoupling capacitor may also be connected to Metallic Laminate 32 and shielded by guard structures. Such guard structures are well known to persons skilled in the art.

Figure 7B:
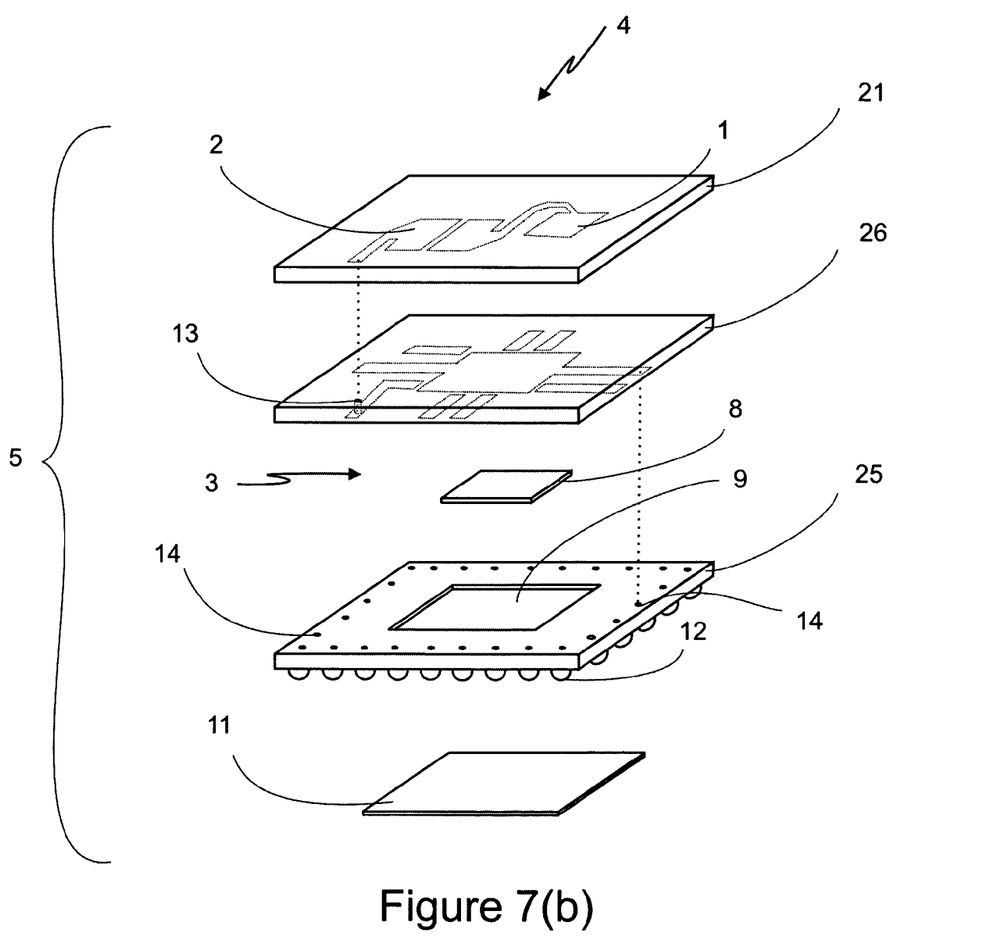
Figure 7C:
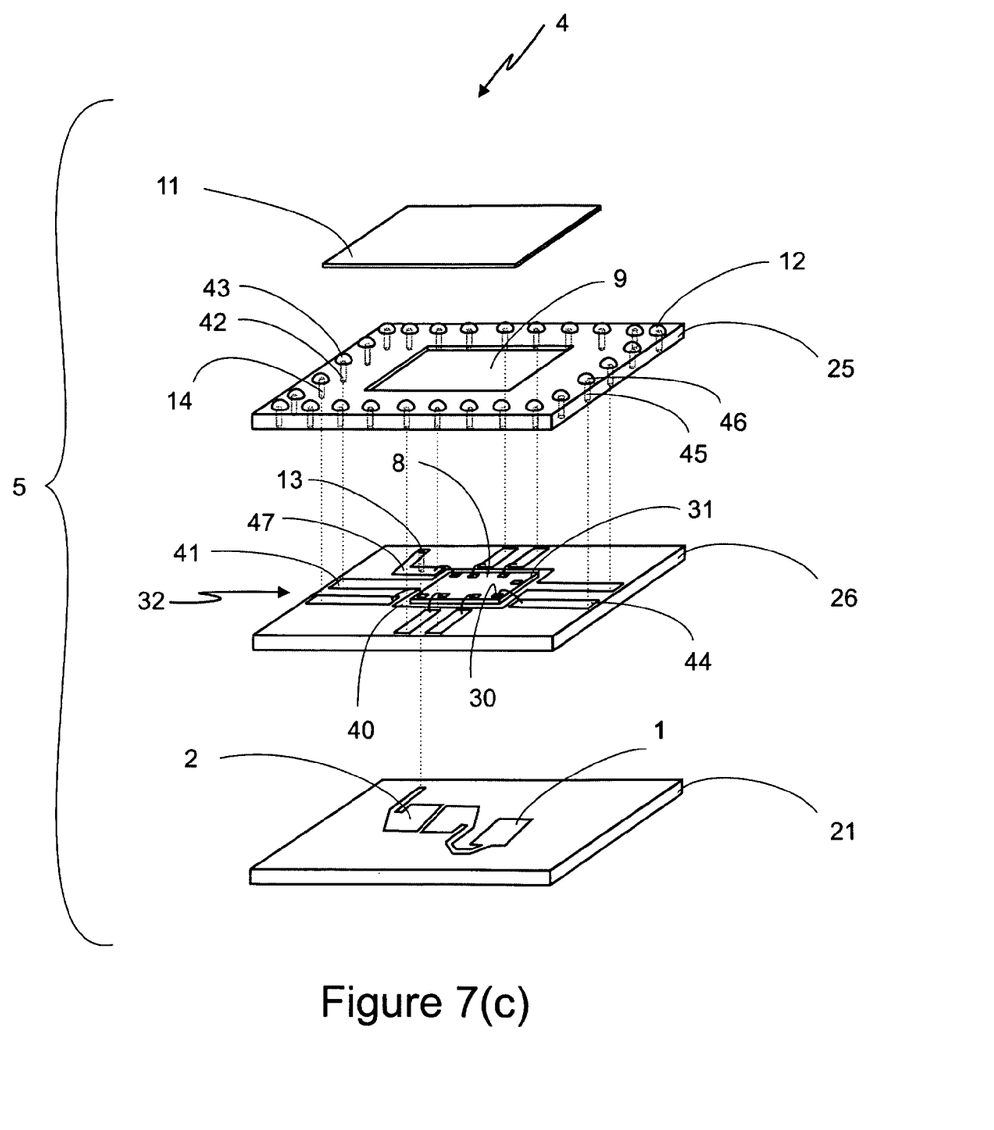

An exploded diagram of the cross-sectional view RF Transceiver 4 in FIG. 7(a) is depicted in FIG. 7(b), the second embodiment of the present invention. FIG. 7(b) is a three dimensional view from the top view and where IC Die 8 is shown unconnected. FIG. 7(c) is a three dimensional view of the same from the bottom view and with IC Die 8 bonded and adhered to metal laminate Layer 26, that is Device Package 5 is turned upside down and viewed accordingly. FIG. 7(b) will now be described followed by FIG. 7(c).

In FIG. 7(b), Device Package 5 comprises 3 high dielectric layers, 21, 26, and 25, and when stacked (and processed accordingly) forms the composite housing of the Device Package 5 shown in FIG. 7(a) previously. Layer 21 serves as a means to provide a top surface of Device Package 5. Antenna 1 and Filter 2 are realized on the bottom surface of Layer 21. Antenna 1 may be a patch antenna as described previously herein and is part of a metallic laminate on the bottom surface of Layer 21. Connected to Antenna 1 is Filter 2. Filter 2 may be realized as two-patch resonators and is part of the metallic laminate on the bottom surface of Layer 21. The left end of Filter 2 is connected to Via 13 in Layer 26 and is connected to Radio Electronics 3 via a metal laminate track (refer to FIG. 7(c)) on the bottom surface of Layer 26. IC Die 8 of Radio Electronics 3 resides in Cavity 9 and is conductively adhered and bonded to the metallic laminate structures on the bottom surface of Layer 26 (refer to FIG. 7(c)). The interconnections of IC Die 8 are connected to Solder Ball 12 via Via 14 that goes through Layer 25. Cavity 9 of Device Package 5 may be hermetically sealed with Sealing Metal Cap 11 or may be filled with a resin as a means of protecting Radio Electronics 3.

FIG. 7(c) depicts how IC Die 8 may be connected to Filter 2 and to Solder Balls 12. IC 8 is adhered to Metallic Laminate 32, specifically to the large metal ground plate Metallic Laminate 40 that is connected Metal Track 41. Metal Track 41 is connected to Via 42 and finally to Solder Ball 43 that serves as the ground pin of Device Package 5. Several of the bond pads of IC Die 8 are connected to their respective solder balls. For example, Bond Pad 30 is bonded to Metal Track 44 and connected to Solder Ball 46 via Via 45. Filter 2 is connected to IC 8 by means of Via 13 connected to Metal Track 47. IC Die 8 resides within Cavity 9. Cavity 9 may be filled with a resin or hermetically sealed with Sealing Metal Cap 11.

Figure 8:
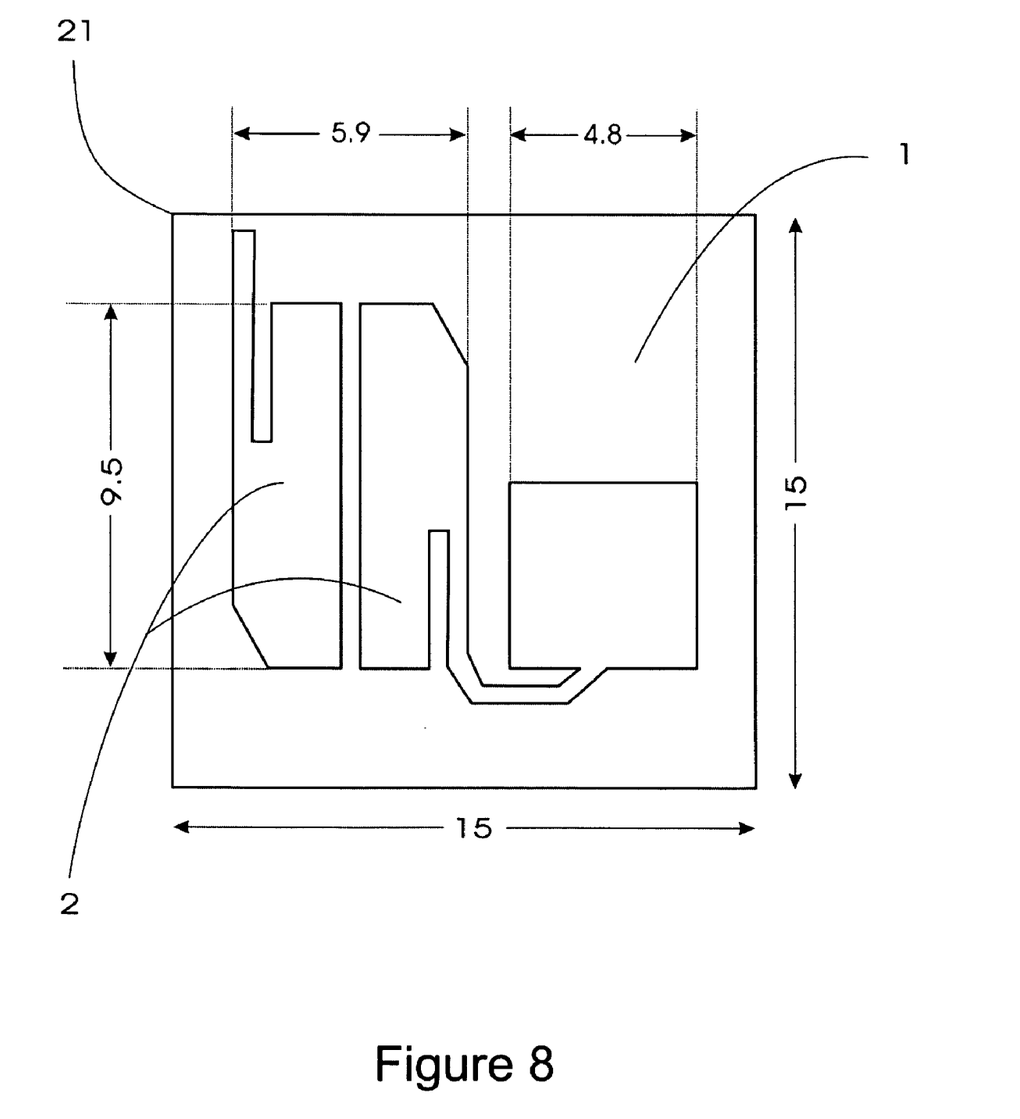
FIG. 8 is the top view of the metallic structure of the antenna and the filter in accordance with the invention.

FIG. 8 depicts the top view of Layer 21 where Filter 2 and Antenna 1 are located. The dimensions of one design example of Filter 2 and Antenna 1 are also shown (in millimeters).

Figure 9A:
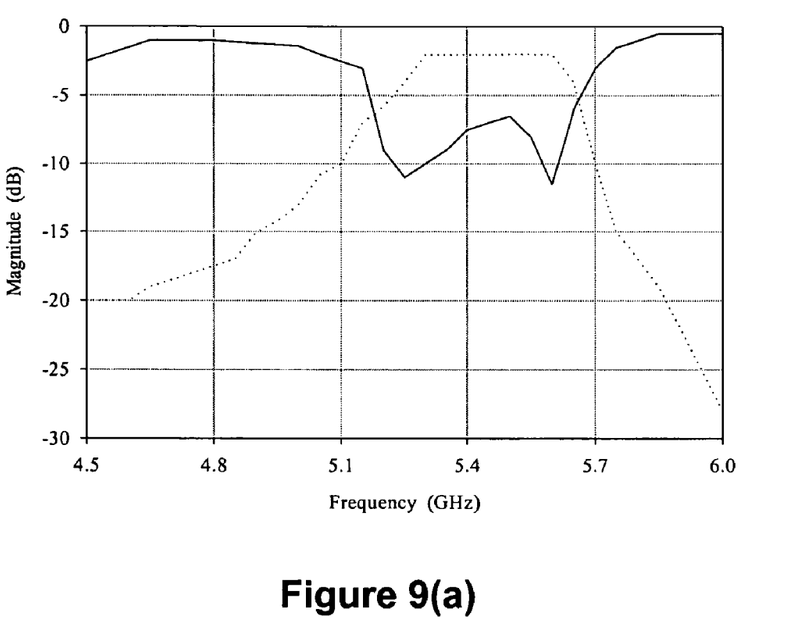
FIG. 9(a) and FIG. 9(b) are the basic parameters of the antenna and the filter in accordance with the invention.
Figure 9B:
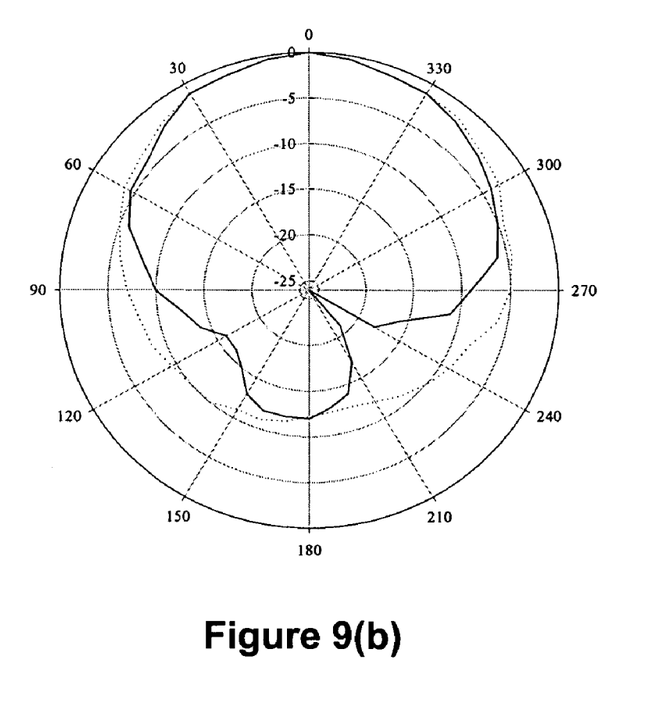

FIG. 9(a) and 9(b) depict the basic parameters of the performance of Filter 2 and Antenna 1 realized in the housing of Device Package 5 that is based on LTCC. The basic parameters are the return loss and insertion loss of Filter 2 and the co-field co-polarized radiation pattern of Antenna 1. In FIG. 9(a), the return loss is plotted with a bold line while the insertion loss is plotted with a dotted line. In FIG. 9(b), the radiation pattern in the E-plane is plotted with a bold line and in the H-plane with dotted line. These plots depict the efficacy of the invention wherein Filter 2 and Antenna 1 are simultaneously realized in the housing of Device Package 5 of RF Transceiver 4.

It should be clear that a person skilled in the art can easily apply the invention in a number of ways. For example, Filter 2 and Antenna 1 need not be on the same layer in Housing 5 of RF Transceiver 4. In other words, Filter 2 and Antenna 1 may be on separate layers but realized in the housing of Device Package 5 of RF Transceiver 4.

It should be clear that a person skilled in the art can design Filter 2 in the housing of Device Package 5 of RF Transceiver 4 in a number of ways other than the two-patch resonator design shown above herein.

It should be clear that a person skilled in the art can design Antenna 1 in the housing of Device Package 5 of RF Transceiver 4 in a number of ways other than the patch antenna shown above herein.

It should be clear that a person skilled in the art can realize Filter 2 and Antenna 1 in the housing of Device Package 5 of RF Transceiver 4 using other high dielectric materials other than LTCC.

It should be clear that a person skilled in the art can realize Filter 2 and Antenna 1 in the housing of Device Package 5 that is cavity-down as opposed to cavity-up shown described herein.

Having described the above embodiments with reference to the accompanying drawings, it is to be understood that the invention is not limited to these embodiments and that various changes and modifications can be made by one skilled in the art without departing from the spirit and scope of the novel concepts of the invention as defined in the appended claims.

The invention claimed is:

1. A device package comprising at least a housing, at least one integrated circuit die, at least one filter and at least one antenna,
   wherein said device package comprises at least two metallic laminates in said housing wherein a first metallic laminate realizes a filter and an antenna,
   wherein said filter and said antenna are separate entities, and
   wherein said at least one integrated circuit die is connected to a second metallic laminate.

2. A device package set forth in claim 1, wherein said second metallic laminate is on the surface of one of the internal walls of said device package.

3. A device package set forth in claim 1, wherein said device package embodies at least one radio frequency transceiver.

4. A device package set forth in claim 1, wherein said housing of said device package is based on Low Temperature Co-fired Ceramic material.

5. A device package set forth in claim 1, wherein said device package is a Ball Grid Array.

6. A device package set forth in claim 1, wherein said first metallic laminate is placed above said second. metallic laminate.

7. A device package set forth in claim 1, wherein at least one other metallic laminate is placed between said first metallic laminate and said second metallic laminate.

8. A device package set forth in claim 7, wherein said at least one other metallic laminate is grounded.

9. A device package set forth in claim 1, wherein a plurality of metallic laminates is placed between said first metallic laminate and said second metallic laminate.

10. A device package set forth in claim 9, wherein said plurality of metallic laminates is used to realize embedded passive components.

11. A device package set forth in claim 9, wherein at least one of said plurality of metallic laminates is grounded.

12. A device package comprising at least a housing, at least one substrate base, at least one filter and at least one antenna,
    wherein said device package comprises at least two metallic laminates in said housing,
    wherein a first metallic laminate realizes a filter and an antenna,
    wherein said filter and said antenna are separate entities, and
    said at least one substrate base is connected to a second metallic laminate on one surface of said device package.

13. A device package set forth in claim 12, wherein said device package has at least one integrated circuit die connected to thereof

14. A device package set forth in claim 12, wherein said device package is based on Low Temperature Co-fired Ceramic material.

15. A device package set forth in claim 12, wherein at least one other metallic laminate is placed between said first metallic laminate and said second metallic laminate.

16. A device package set forth in claim 15, wherein said at least one other metallic laminate is grounded.

17. A device package set forth in claim 12, wherein a plurality of metallic laminates is placed between said first metallic laminate and said second metallic laminate.

18. A device package set forth in claim 17, wherein said plurality of metallic laminates is used to realize embedded passive components.

* * * * *